United States Patent [19]

Strauss et al.

[11] Patent Number: 5,529,673
[45] Date of Patent: Jun. 25, 1996

[54] MECHANICALLY JOINED SPUTTERING TARGET AND ADAPTER THEREFOR

[75] Inventors: David P. Strauss, Glen Rock, N.J.; Thomas J. Hunt, Peekskill; Paul S. Gilman, Suffern, both of N.Y.

[73] Assignees: Sony Corporation, Tokyo, Japan; Materials Research Corporation, Orangeburg, N.Y.

[21] Appl. No.: 390,662

[22] Filed: Feb. 17, 1995

[51] Int. Cl.⁶ .................................................. C23C 14/34
[52] U.S. Cl. ................................................... 204/298.12
[58] Field of Search ........................................ 204/298.12

[56] References Cited

U.S. PATENT DOCUMENTS

| | | | |
|---|---|---|---|
| 4,820,397 | 4/1989 | Fielder | 204/298.12 |
| 4,855,033 | 8/1989 | Hurwitt | 204/298.09 |
| 5,009,765 | 4/1991 | Qamar et al. | 204/298.12 |
| 5,147,521 | 9/1992 | Belli et al. | 204/298.12 |
| 5,269,403 | 12/1993 | Pouliquen et al. | 204/298.12 |

FOREIGN PATENT DOCUMENTS 2-285069  11/1990  Japan ................................ 204/298.12

*Primary Examiner*—Aaron Weisstuch
*Attorney, Agent, or Firm*—Wood, Herron & Evans

[57] ABSTRACT

A target assembly in which the sputtering material is not soldered or otherwise metallurgically bonded to a backing plate. Rather, the target, which is homogeneously manufactured of sputtering material, is mechanically coupled (e.g., with bolts) to an adapter, which is itself permanently affixed to the chamber. As a result, the target can be easily uncoupled from the chamber and replaced, without also requiring removal and replacement of a backing plate.

19 Claims, 3 Drawing Sheets

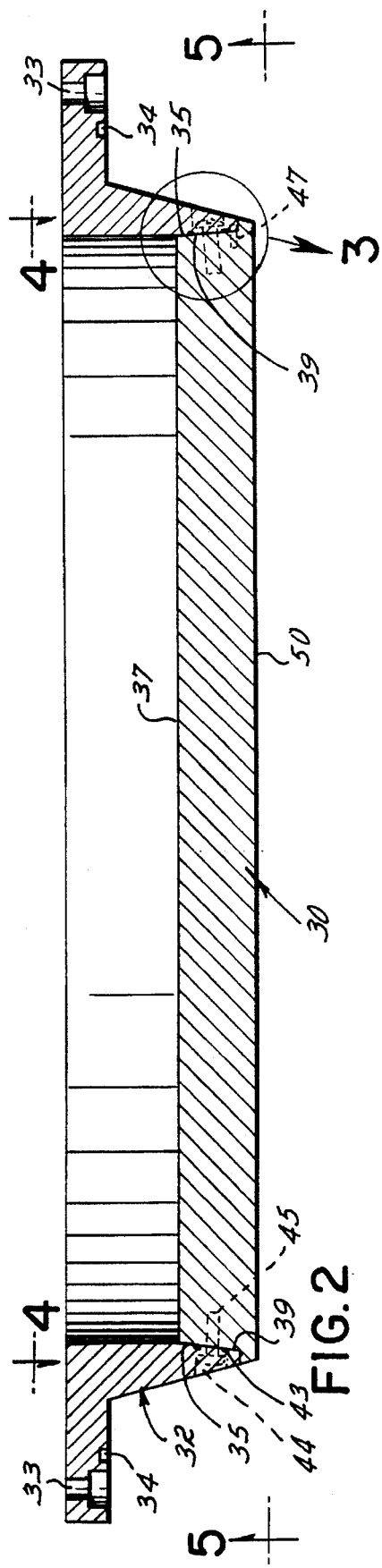
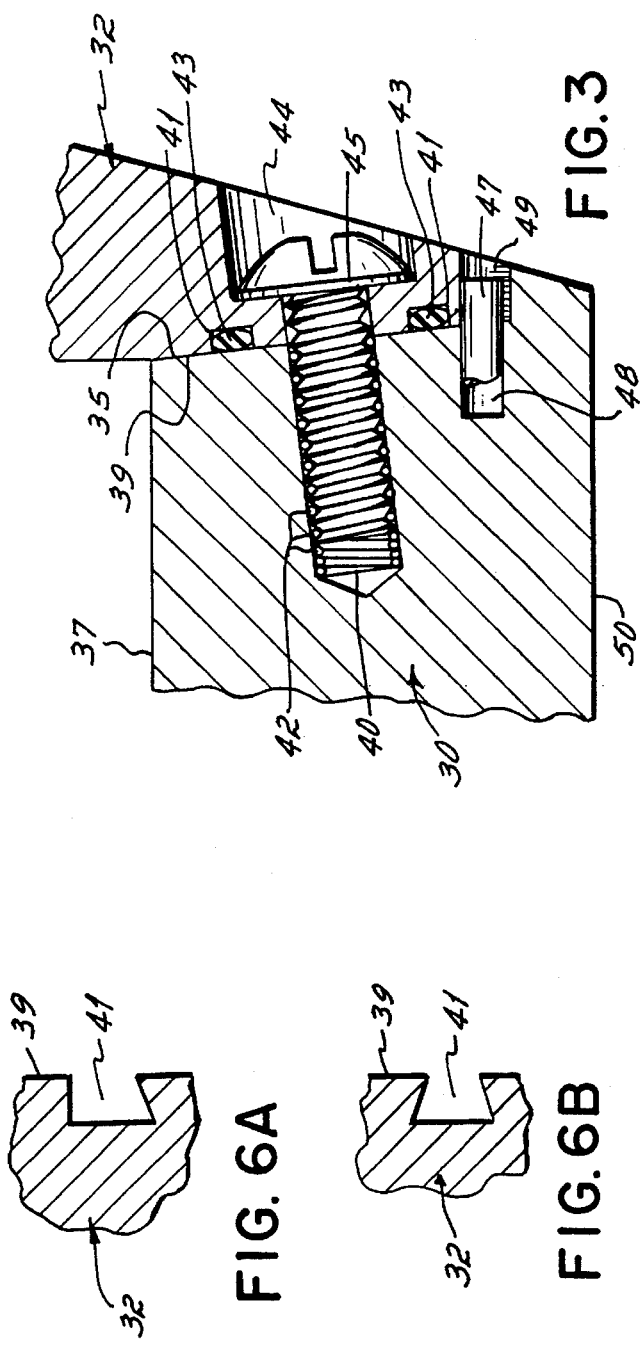

5,529,673

MECHANICALLY JOINED SPUTTERING TARGET AND ADAPTER THEREFOR

FIELD OF THE INVENTION

This invention relates to targets for plasma sputtering apparatus.

BACKGROUND OF THE INVENTION

Sputtering processes are typically performed in a vacuum chamber. The chamber includes a target comprised of material, such as Aluminum, to be sputtered. A substrate, such as a semiconductor wafer bearing integrated circuits, is placed in the chamber and the chamber is evacuated. Once the chamber is evacuated, a process gas is introduced into the chamber at a low pressure, and a voltage is applied to the target. Ionized gas in the chamber is accelerated by the electric fields of the target. When the ions impinge upon the target, atoms of sputtering material are dislodged ("sputtered") from the target. The dislodged atoms deposit on the substrate, forming, over time, a thin film of target material on the substrate.

The sputtering process described above slowly wears material from the target until, ultimately, the target must be renewed. Typically, this is done by removing the target from the chamber and inserting a new target into the chamber.

FIG. 1 is a cross-sectional view of a typical vacuum chamber 10 for performing a sputtering process, and a target assembly 12 mounted in this chamber. Chamber 10 is generally cylindrical or rectangular in shape, and target 12 is generally disk-shaped and mounts into a circular opening 13 in chamber 10. Wafer 14, which is disk-shaped, is supported inside of chamber 10 by a generally disk-shaped anode 16. Electrical power is applied to the anode 16 with respect to the remainder of the chamber 10.

As shown in FIG. 1, a typical target is manufactured of a backing plate 20 of a metal such as Copper, metallurgically bonded (e.g., soldered) to a target plate having a front face 22 of sputtering material. Backing plate 20 is affixed to a chamber cover 23 by mounting screws 24. Cover 23, is clamped to chamber 10 by means not shown, and supports the front face 22 in a position generally opposite wafer 14. An O-ring inserted into groove 26 prevents leakage into the chamber 10 through the target-chamber interface. During the sputtering process, material from front face 22 is removed and deposited on the wafer 14, while backing plate remains in place.

Over time, a typical target such as that shown in FIG. 1 wears to the extent that the sputtering material on the front face 22 must be renewed. When this occurs, cover 23 is lifted from chamber 10, and target assembly 12 is detached from cover 23 and removed. A new target assembly 12 is then assembled to cover 23, and cover 23 is clamped onto chamber 10, and processing continues.

Backing plates are typically manufactured of expensive metals, and for this reason are typically recycled after use. Once a worn target assembly has been removed from the cover 23, the backing plate and the remaining sputtering material soldered thereto, are returned to the manufacturer. The manufacturer removes the remaining sputtering material from the backing plate, and solders a new target plate having a front face 22 of sputtering material to the backing plate. The target assembly 12, consisting of the recycled backing plate and new front face of sputtering material, is then ready for resale. To ensure that processing facilities promptly return used target assemblies to the manufacturer, manufacturers typically include a core charge in the price of each target sold; this charge is refunded upon return of the used target to the manufacturer.

This process for recycling used targets is inconvenient in that it requires regular shipment of bulky and heavy targets back to the manufacturer. Furthermore, to ensure a sufficient stockpile of targets to avoid downtime, semiconductor fabrication facilities must retain in inventory a number of new target assemblies 12, which involves essentially permanent payment of the core charges associated with the target assemblies held in inventory.

SUMMARY OF THE INVENTION

In accordance with the invention, the above disadvantages are overcome by providing a target assembly in which the sputtering material is not soldered or otherwise metallurgically bonded to a backing plate. Rather, the target is mechanically coupled (e.g., with bolts) to the chamber. As a result, the sputtering material can be easily uncoupled from the chamber and replaced, without also requiring removal and replacement of a backing plate.

Specifically, in one aspect the invention features an adapter sized for permanent mounting to the chamber at the same attachment points as the target assembly shown in FIG. 1. The adapter has a central aperture in which the adapter supports a target. Mechanical couplers inserted through the adapter and the target mechanically join the target to the adapter. The target is manufactured homogeneously of sputtering material, and can be separately installed into and removed from the chamber without removing the adapter. As a result, when the target is worn, the target can be replaced without requiring refurbishing of the adapter.

In specific embodiments, the adapter, which may be of Copper, has a generally cylindrical shape, with generally cylindrical supporting walls and a generally radial flange sized for mounting to the chamber in place of the prior art target assembly. Apertures through the cylindrical supporting walls of the adapter receive the mechanical couplers, which may be bolts. The target, which is a single piece of machined material such as Aluminum or Aluminum Oxide, has a disk shape, and has apertures in its cylindrical outer periphery arranged in mating relation to the apertures in the cylindrical supporting walls of the adapter. Helicoils are inserted into the apertures in the target, and the bolts inserted through the apertures in the adapter are threaded into these helicoils and thus couple the target to the adapter.

The target also has an indexing pin projecting from its cylindrical outer periphery. This pin mates with a slot in the adapter. The pin and slot are positioned such that when the pin is received into the slot, the apertures of the target and the adapter are aligned.

In further aspects the invention features a target having features described above.

The above and other objects and advantages of the present invention shall be made apparent from the accompanying drawings and the description thereof.

BRIEF DESCRIPTION OF THE DRAWING

The accompanying drawings, which are incorporated in and constitute a part of this specification, illustrate embodiments of the invention and, together with a general description of the invention given above, and the detailed description of the embodiments given below, serve to explain the principles of the invention.

FIG. 2 is a cross-sectional view of a target 30 and adapter 32 in accordance with principles of the present invention;

FIG. 3 is a detail view of the mechanical joint between adapter 32 and target 30 of the sputtering target assembly of FIG. 2;

FIGS. 6A and 6B illustrate alternative embodiments of grooves 41 of the adapter 32 of FIG. 2.

DETAILED DESCRIPTION OF SPECIFIC EMBODIMENTS

Referring to FIGS. 2–5, a target assembly in accordance with principles of the present invention includes a target 30 of sputtering material, for example, Aluminum or Aluminum Oxide. This target 30 is mechanically joined to an adapter 32. The completed assembly of target 30 and adapter 32 has the same shape as the prior art target assembly shown in FIG. 1.

Target 30 is a substantially disk-shaped plate manufactured of sputtering material such as Aluminum or Aluminum Oxide. Adapter 32 is manufactured of a metal suitable for supporting target 30 against vacuum pressure in chamber 10. Materials currently used in target backing plates such as Copper are suitable for this purpose.

Figure 1:
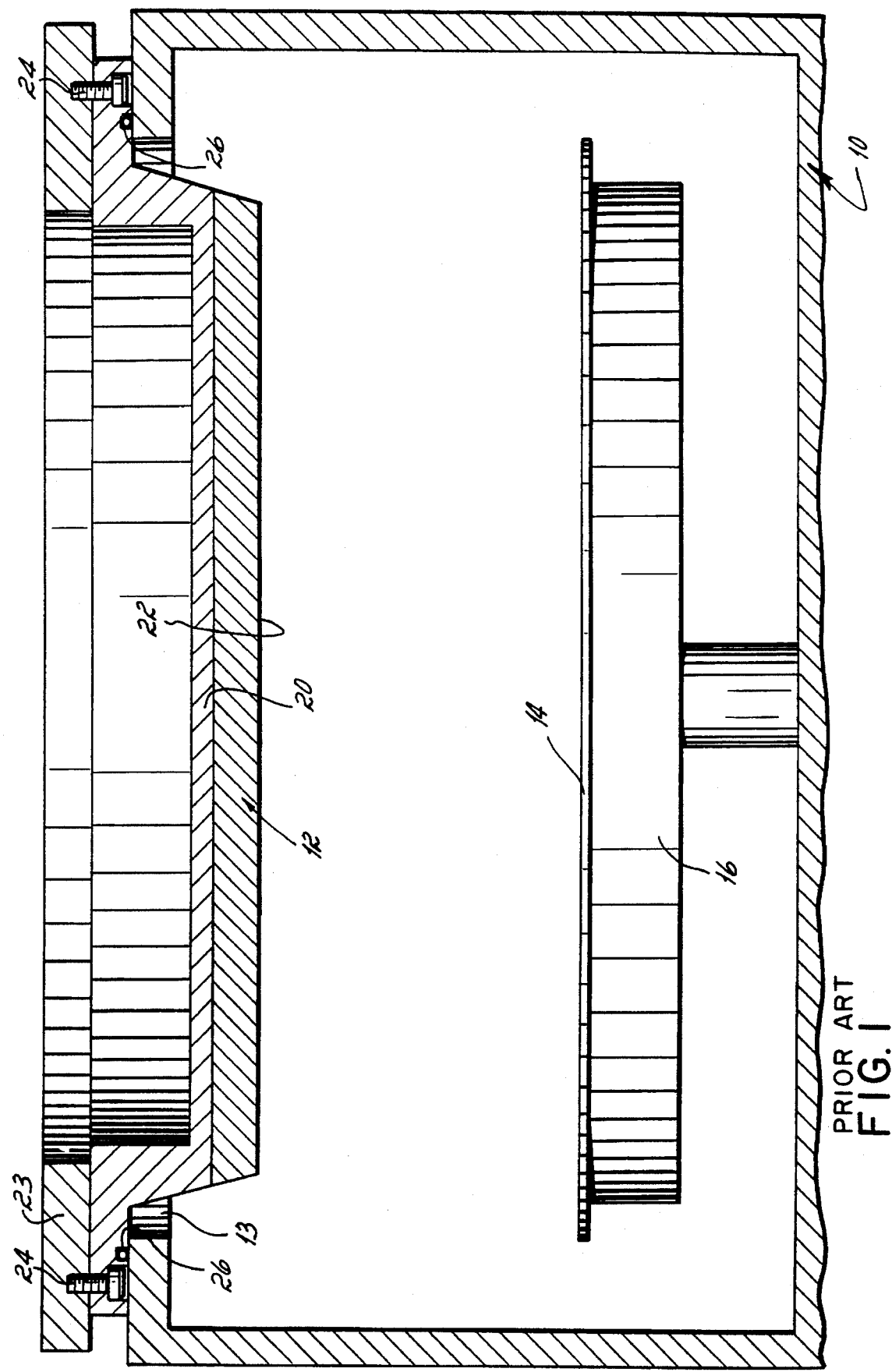
FIG. 1 is a cross-sectional view of a sputtering target assembly and chamber in accordance with the prior art.

Adapter 32 is mounted to cover 23 of chamber 10 using bolts inserted through apertures 33, in the same manner as the prior art target shown in FIG. 1. Apertures 33 have the same position and diameter as those found in the prior art target shown in FIG. 1. Further, adapter 32 includes a groove 34 having the same location and size as groove 26 in the prior art target shown in FIG. 1. Groove 34 holds an O-ring of the same size as that held in groove 26, thereby preventing leakage into the chamber through the interface of the adapter 32 and the chamber 10.

The diameter of target 30 across its outer periphery 35 is approximately 11.5 inches, and the inner diameter of adapter 32 along its inner periphery 39 is approximately identical, to permit exact coupling of target 30 to adapter 32. The thickness of target 30 is approximately 0.74 inches, and the thickness of the assembly of target 30 and adapter 32, shown in FIG. 2, is approximately 1.91 inches. These dimensions are exactly compatible with those of the prior art target shown in FIG. 1.

Referring to FIG. 3, there is shown a detailed view of the mechanical joint between target 30 and adapter 32. The outer periphery 35 of target 30 is sloped at an angle of approximately 6 degrees relative to the central axis of target 30, such that the angle between surface 37 of target 30 and outer periphery 35 is approximately 96 degrees. Adapter 32, along its inner periphery 39, is sloped at a corresponding angle of 6 degrees relative to the central axis of adapter 32. The relative diameters of target 30 and adapter 32 along peripheries 35 and 39 are matched such that outer periphery 35 and inner periphery 39 are in full contact when the outer periphery 35 of target 30 is inserted into the inner periphery 39 of adapter 32.

Adapter 32 includes, along inner periphery 39, two grooves 41 approximately 0.125 inches wide, suitable to receive two O-rings 43. O-rings 43 create a tight seal between target 30 and adapter 32, and thereby reduce leakage into the chamber through the interface between target 30 and adapter 32. Referring to FIGS. 6A and 6B, the walls of grooves 41 are "dovetailed" i.e., are sloped inwardly to capture an O-ring inside of the groove. A single sloped wall, such as shown in FIG. 6A, or a double sloped wall such as shown in FIG. 6B, may be used.

Figure 5:
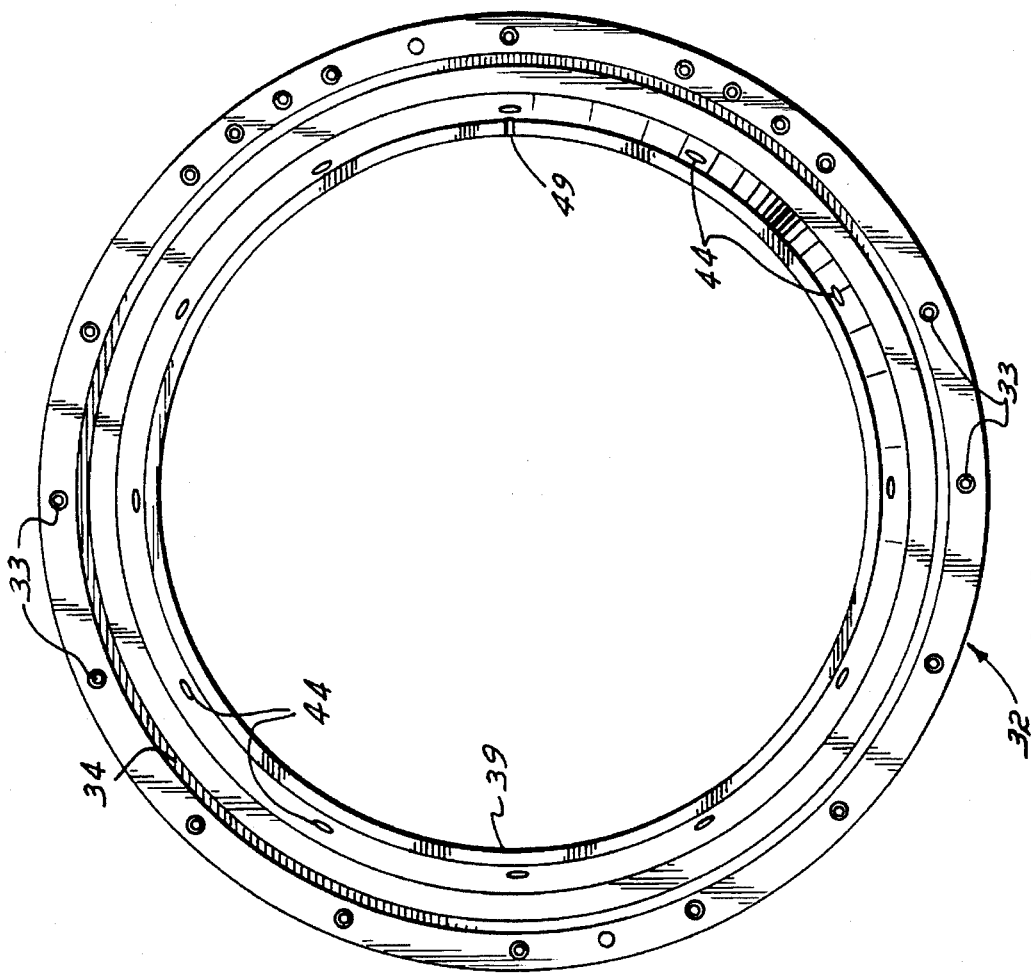
FIG. 5 is a plan view of adapter 32 as viewed along line 5—5 in FIG. 2, with target 30 removed.
Figure 4:
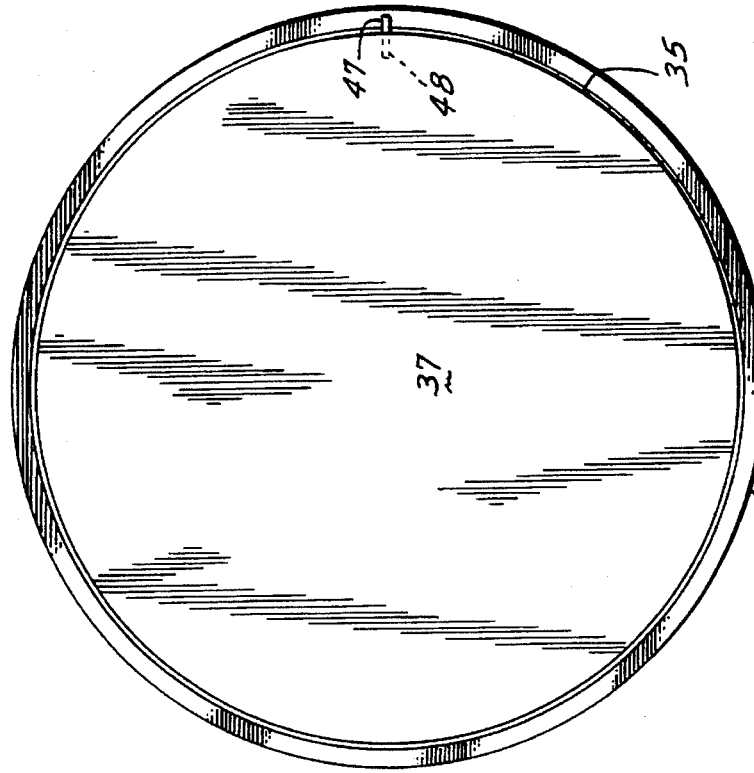
FIG. 4 is a plan view of target 30 as viewed along line 4—4 in FIG. 2, with adapter 32 removed.

Target 30 includes, at various spaced locations along it periphery 35, apertures 40, which are sized to receive 8–32 Helicoil fasteners 42. Adapter 32 includes apertures 44 at spaced locations located at positions corresponding to apertures 40 in target 30. In one embodiment, there are twelve such apertures radially evenly spaced around the respective peripheries 35, 39 of target 30 and adapter 32, as seen in FIG. 5. Apertures 40 and 44 are centered between grooves 41, and are drilled at right angles to the surfaces of respective peripheries 35 and 39 of the target 30 and adapter 32; thus, these apertures are at a 6 degree angle relative to a plane perpendicular to the central axis of target 30 and adapter 32.

In use, adapter 32 is permanently attached to cover 23 of chamber 10 in the manner shown in FIG. 1. Target 30 can be replaced separately from adapter 32. To mechanically join target 30 to adapter 32, each aperture 40 in target 30 is loaded with an 8–32 Helicoil fastener 42. Also, grooves 41 are loaded with suitably sized O-rings 41. Next, target 30 is inserted into adapter 32, such that apertures 40 in target 30 are in alignment with apertures 44 in adapter 32. Next, 8–32 bolts 45 of suitable length, e.g., 0.5 inch, are inserted through apertures 44 and into apertures 40, engaging the threads of Helicoils 42 in apertures 44. Bolts 45 are then torqued to a sufficient level to form a seal between target 30 and adapter 32.

To assist the user in properly aligning target 30 to adapter 32, target 30 includes, at one or more locations along its outer periphery, a 0.087 inch diameter roll pin 47, which is inserted into an aperture 48 such that an outer end of pin 47 extends radially outward from outer periphery 35 of target 30. (See FIG. 4.) Adapter 32 includes one or more slots 49 cut into inner periphery 39 of adapter 32 and sized to receive roll pin 47 (see FIG. 5.) Roll pin 47 and slot 49 are positioned such that, when roll pin 47 is received into slot 49, apertures 40 and 44 of target 30 and adapter 32 are in alignment. Thus, roll pin 47 facilitates proper alignment of target 30 into adapter 32. Other combinations of mating features can be used to facilitate alignment, such as, for example, a protrusion in the inner periphery 39 of the adapter which mates to a slot in the target 30.

In use, target 30 is installed to adapter 32, and sputtering is performed from surface 50 of target 30 until excessive wear requires replacement of target 30. At this point, bolts 45 are extracted, and target 30 is removed from adapter 32. Then a new target 30 received from the manufacturer is attached to adapter 32 in place of the worn target 30.

An advantage of this process is that the worn target 30 need not be returned to the manufacturer for recycling. Rather, the target material may be disposed or recycled as scrap metal. Thus, in accordance with the principles of the present invention, it is not necessary to repeatedly return worn targets to the manufacturer for refurbishing. Furthermore, it is not necessary for the manufacturer to make a core charge to ensure timely return of worn targets to permit recovery of backing plates.

Another potential advantage of the invention is increased target life. There are two factors limiting the amount of wear that target 30 can undergo before replacement is required.

First, target 30 must be self-supporting; that is, target 30 bears the stress of vacuum pressure in the chamber without support from a backing plate as is found in the prior art target of FIG. 1. It has been found that a target manufactured of Aluminum or Aluminum Oxide has sufficient stiffness to support this stress, at least until the target has worn to the point that the thickness of the target in its central section is approximately equal to the thickness of the backing plate 20 shown in FIG. 1.

Second, referring specifically to FIG. 3, at the periphery of target 30, there is a thickness of approximately 0.375 to 0.5 inches of sputtering material between aperture 40 containing bolt 45, and the surface 50 of the target which is exposed to the interior of the chamber. Wear in this area of the target will eventually expose bolt 45 and roll pin 47. However, it has been discovered that the rate of wear of target 30 on surface 50 is most rapid in the area of the target 30 nearest to its central axis. Some wear occurs near to the periphery of the target; however, the proportionate rate of wear at the center of the target is such that the target must be replaced due to wear in the central region well before there is any exposure of pin 49 or aperture 40.

It appears that the target 30 shown in FIG. 2 may provide a longer term of use than the prior art target shown in FIG. 1. In the prior art target shown in FIG. 1, wear cannot proceed beyond the point where the solder bond between the target and backing plate is exposed, since contamination would result. In fact, target use must halt some time before the solder bond is exposed to provide a margin for error. By contrast, in the target 30 shown in FIG. 2, the allowable amount of wear is not limited by the presence of a solder bond, but only by the requirement that the target remain self-supporting. It has been found that target 30 can remain self-supporting even though target 30 has been worn to an extent that would have exposed the solder bond in the target of FIG. 1. Therefore, it appears that the target 30 in accordance with the invention may provide a longer life than the prior art structure shown in FIG. 1.

While the present invention has been illustrated by a description of various embodiments 15 and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A target assembly removably mountable in an opening in a wall of a vacuum chamber for processing a substrate by causing sputtering material to be ejected from the target assembly onto said substrate, comprising:

an adapter having an inner peripheral surface defining an aperture, said adapter being sized for mounting in the opening of the chamber;

a target of said sputtering material, an outer periphery of said target being sized and configured to be inserted into said aperture, such that said target contacts said adapter only along said inner peripheral surface of said adapter; and mechanical couplers inserted through said adapter and said target to mechanically join said target to said inner peripheral surface of said adapter.

2. The target assembly of claim 1, wherein said adapter has a generally cylindrical shape.

3. The target assembly of claim 2, wherein said adapter includes generally cylindrical supporting walls, coupled to a generally radial flange sized for mounting to said chamber, said cylindrical supporting walls of said adapter defining openings for receiving said mechanical couplers.

4. The target assembly of claim 3 wherein said target has a disk shape, said target defining openings in its cylindrical outer periphery arranged in mating relation to said openings defined by said cylindrical supporting walls of said adapter.

5. The target assembly of claim 4 wherein said mechanical couplers comprise coil-shaped coupling members inserted into the openings defined by said target and bolts inserted through the openings defined by said adapter and threaded into said coil-shaped coupling members.

6. The target assembly of claim 4 wherein one of said outer periphery of said target and said inner peripheral surface of said adapter further comprises an indexing projection and the other of said outer periphery of said target and said inner peripheral surface of said adapter further defines a slot sized to receive said indexing projection; and said projection and slot are positioned such that when said projection is received into said slot, said openings of said target and said adapter are aligned.

7. The target assembly of claim 1 wherein said sputtering material is a metal.

8. The target assembly of claim 1 wherein said sputtering material is aluminum or an oxide thereof.

9. A target for installation in a vacuum chamber adapter for processing a substrate by causing sputtering material to be ejected from the target onto said substrate, comprising a generally disk shaped section having a cylindrical outer periphery, manufactured homogeneously of said sputtering material, said disk shaped section defining openings in its cylindrical outer periphery for receiving mechanical couplers for mechanically joining said target to said vacuum chamber adapter, and coil-shaped coupling members inserted into said openings.

10. The target of claim 9 wherein said sputtering material is a metal.

11. The target of claim 9 wherein said sputtering material is aluminum or an oxide thereof.

12. A target for installation in a vacuum chamber adapter for processing a substrate by causing sputtering material to be ejected from the target onto said substrate, comprising a generally disk shaped section having a cylindrical outer periphery, manufactured homogeneously of said sputtering material, said disk shaped section defining openings in its cylindrical outer periphery for receiving mechanical couplers for mechanically joining said target to said vacuum chamber adapter, and an indexing projection on the cylindrical outer periphery of said target.

13. Apparatus for processing a substrate by causing sputtering material to be ejected from a target onto said substrate, comprising:

a vacuum chamber having an adapter attached thereto with an inner peripheral surface defining an aperture for receiving a target, and an anode for supporting the substrate in proximal face-to-face relation to said target;

a target of said sputtering material, an outer periphery of said target being sized and configured to be inserted into said aperture, such that said target contacts said chamber only along said inner peripheral surface of said aperture; and mechanical couplers inserted through said adapter and said target to mechanically join said target to said inner peripheral surface of said aperture.

14. The apparatus of claim 13, wherein said inner peripheral surface of said chamber defines openings for receiving said mechanical couplers.

15. The apparatus of claim 14 wherein said target has a disk shape, said target defining openings in its cylindrical outer periphery arranged in mating relation to said openings defined by inner peripheral surface of said chamber.

16. The target assembly of claim 15 wherein said mechanical couplers comprise coil-shaped coupling members inserted into the openings defined by said target and bolts inserted through the openings defined by said inner peripheral surface of said chamber and threaded into said coil-shaped coupling members.

17. The target assembly of claim 15 wherein one of said target and said inner peripheral surface of said chamber further comprises an indexing projection, and the other of said target and said inner peripheral surface of said chamber further defines a slot sized to receive said indexing projection; and said projection and slot are positioned such that when said projection is received into said slot, said openings of said target and said chamber are aligned.

18. The target assembly of claim 13 wherein said sputtering material is a metal.

19. The target assembly of claim 13 wherein said sputtering material is aluminum or an oxide thereof.

\* \* \* \* \*